United States Patent
Lee et al.

(10) Patent No.: US 7,105,869 B2
(45) Date of Patent: Sep. 12, 2006

(54) MULTI-CHIP PACKAGE

(75) Inventors: Jui-Chung Lee, Touliu (TW); Ji-Gang Lee, Jhongpu Township, Chiayi County (TW); Jing-Ming Chiu, Hengshan Township, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 33 days.

(21) Appl. No.: 10/975,360

(22) Filed: Oct. 29, 2004

(65) Prior Publication Data
US 2006/0097282 A1   May 11, 2006

(51) Int. Cl.
*H01L 31/072* (2006.01)
(52) U.S. Cl. .................. 257/197; 257/777; 257/673; 257/780
(58) Field of Classification Search ............. 257/777, 257/780, 673, 778
See application file for complete search history.

(56) References Cited
U.S. PATENT DOCUMENTS
6,861,760 B1 * 3/2005 Oka et al. .............. 257/777

2004/0061202 A1   4/2004   Shim, II

FOREIGN PATENT DOCUMENTS
TW   443587   6/2001
TW   494554   7/2002
TW   510573   11/2002

* cited by examiner

*Primary Examiner*—Mai-Huong Tran
(74) *Attorney, Agent, or Firm*—Rabin & Berdo, PC

(57) ABSTRACT

A multi-chip package is provided. A first die pad has a first chip attaching surface and a first unoccupied surface. A second die pad has a second chip attaching surface and a second unoccupied surface. The connecting structures are used for connecting the first die pad and the second die pad. The inner leads has wire connecting surfaces. The wire connecting surfaces, the first chip attaching surface and the second unoccupied surface face the same direction. A first chip has a first active surface and a first inactive surface. The first inactive surface is attached to the first chip attaching surface. A second chip has a second active surface and a second inactive surface. Part of the second active surface is attached to the second chip attaching surface. The wires are used for electrically connecting the first active surface and the second active surface to the wire connecting surfaces.

7 Claims, 10 Drawing Sheets

MULTI-CHIP PACKAGE

BACKGROUND OF THE INVENTION

1. Field of the Invention

The invention relates in general to a multi-chip package with leadframe, and more particularly to a multi-chip package whose two chips are separately mounted on at least two die pads at different altitudes.

2. Description of the Related Art

Conventionally, an encapsulant is applied in covering several chips in multi-chip package in order to enhance capacity and function in a package. For example, a multi-chip package is provided by combining and packing two chips having the same or similar sizes. The two chips include the same function or two different functions.

Referring to FIG. 1, it is a cross-sectional view of a conventional multi-chip package. A multi-chip package 10 includes a leadframe 111, two chips 102, 104 having the same size or similar sizes, a dummy chip or a spacer 105, a number of wires 114, 116 and an encapsulant 118. The leadframe 111 has a die pad 106 and a number of inner leads 112. The die pad 106 has a chip attaching surface 106a and an unoccupied surface 106b opposite to the chip attaching surface 106a. Each of the inner leads 112 has a wire connecting surface 112a and a wire non-connecting surface 112b opposite to the wire connecting surface 112a. The chip 102 has an active surface 102a and an inactive surface 102b opposite to the active surface 102a. The peripheral region of the active surface 102a has a number of bond pads 1021. The chip 104 has larger size than the chip 102. The chip 104 has an active surface 104a and an inactive surface 104b opposite to the active surface 104a. The peripheral region of the active surface 104a has a number of bond pads 1041. The inactive surface 104b is attached to the chip attaching surface 106a via an adhesive layer 110, so that the chip 104 is disposed on the die pad 106.

The spacer 105 has smaller size than the chips 102 and 104. The spacer 105 includes an upper surface 105a and a bottom surface 105b opposite to the upper surface 105a. The bottom surface 105b is attached to the central region of the active surface 104a via an adhesive layer 109, so that the spacer 105 is disposed on the chip 104. Part of the inactive surface 102b is attached to the upper surface 105a via an adhesive layer 108, so that the chip 102 is disposed on the spacer 105. The wires 114 are used for electrically connecting the bond pads 1021 to the wire connecting surfaces 112a. The spacer 105 is used for providing a distance between the chips 102 and 104 to avoid the chip 102 pressing the wires 116. The wires 116 are used for electrically connecting the bond pads 1041 to the wire connecting surfaces 112a. The encapsulant 118 is used for covering the die pad 106, the chips 102, 104, the bond pads 1021, 1041, the wires 114, 116 and part of the inner leads 112.

A spacer or a dummy chip is inserted between the two chips with the same size or similar sizes in order to provide a distance between the two chips to avoid the upper chip pressing the wire electrically connected the bottom chip. However, it has to be considered the required thickness and the material costs for the design of inserting the spacer or dummy chip in the multi-chip package. Also, much materials with different coefficient of thermal expansion (CTE), such as the die pad, the spacer or the dummy chip, the two chips, part of the inner leads and the encapsulant, assembled in the multi-chip package will cause the more serious mismatch of coefficient of thermal expansion (CTE) of the multi-chip package and has great effect on the reliability of the multi-chip package.

SUMMARY OF THE INVENTION

It is therefore an object of the invention to provide a multi-chip package whose two chips thereof are separately mounted on two die pads at different altitudes so as to avoid the upper chip pressing the wires electrically connected to the bottom chip. Also, omitting the design of spacers or dummy chips disposed between two chips, problem of more serious mismatch of coefficient of thermal expansion (CTE) can be reduced, so that the reliability of the multi-chip package can be kept.

The invention achieves the above-identified object by providing a multi-chip package including a leadframe, a first chip, a second chip, and a number of wires. The leadframe has a first die pad, a second die pad, a number of connecting structures and a number of inner leads. The first die pad has a first chip attaching surface and a first unoccupied surface opposite to the first chip attaching surface. The second die pad has a second chip attaching surface and a second unoccupied surface opposite to the second chip attaching surface. The connecting structures are used for connecting the first die pad and the second die pad so as to make the first unoccupied surface face the second unoccupied surface. Each of the inner leads has a wire connecting surface. The wire connecting surfaces, the first chip attaching surface and the second unoccupied surface face the same direction. The first chip has a first active surface and a first inactive surface opposite the first active surface. The first active surface has a number of first bond pads. Part of the first inactive surface is attached to the first chip attaching surface. The second chip has a second active surface and a second inactive surface opposite to the second active surface. The second active surface has a number of second bond pads. Part of the second active surface is attached to the second chip attaching surface in the way of avoiding the second chip attaching surface covering the second bond pads. The wires are used for electrically connecting the first bond pads and the second bond pads to the wire connecting surfaces of the inner leads. A space is formed between the first chip and the second chip to avoid the first chip pressing part of the wires electrically connected to the second chip.

It is another object of the invention to provide a multi-chip package including a leadframe, a first chip, a second chip, and a number of wires. The leadframe has a first die pad, a second die pad, a third die pad, a number of connecting structures and a number of inner leads. The first die pad has a first chip attaching surface and a first unoccupied surface opposite to the first chip attaching surface. The second die pad has a second chip attaching surface and a second unoccupied surface opposite to the second chip attaching surface. The third die pad has a third chip attaching surface and a third unoccupied surface opposite to the third chip attaching surface. One part of the connecting structures are used for connecting the first die pad and the second die pad and another part of the connecting structures are used for connecting the second die pad and the third die pad so as to make the first unoccupied surface and the third unoccupied surface both face the second unoccupied surface. Each of the inner leads has a wire connecting surface. The wire connecting surfaces, the first chip attaching surface, the third chip attaching surface and the second unoccupied surface face the same direction. The first chip has a first active surface and a first inactive surface opposite to the first active surface. The first active surface has a number of first bond pads. Part of the first inactive surface is attached to the first chip attaching surface and the third chip attaching surface. The second chip has a second active surface and a second inactive surface opposite to the second active surface. The second active surface has a number of second bond pads. Part of the second active surface is attached to the second chip attaching surface in the way of avoiding the second chip attaching surface covering the second bond pads. The wires are used for electrically connecting the first bond pads and the second bond pads to the wire connecting surfaces of the inner leads. A space is formed between the first chip and the second chip to avoid the first chip pressing part of the wires electrically connected to the second chip.

It is another object of the invention to provide a multi-chip package including a leadframe, a first chip, a second chip, and a number of wires. The leadframe has a first die pad, a second die pad, a third die pad, a number of connecting structures and a number of inner leads. The first die pad has a first chip attaching surface and a first unoccupied surface opposite to the first chip attaching surface. The second die pad has a second chip attaching surface and a second unoccupied surface opposite to the second chip attaching surface. The third die pad has a third chip attaching surface and a third unoccupied surface opposite to the third chip attaching surface. One part of the connecting structures are used for connecting the first die pad and the second die pad. Another part of the connecting structures are used for connecting the first die pad and the third die pad so as to make the second unoccupied surface and the third unoccupied surface both face the first unoccupied surface. Each of the inner leads has a wire connecting surface. The wire connecting surfaces, the first chip attaching surface, the second unoccupied surface and the third unoccupied surface face the same direction. The first chip has a first active surface and a first inactive surface opposite to the first active surface. The first active surface has a number of first bond pads. Part of the first inactive surface is attached to the first chip attaching surface. The second chip has a second active surface and a second inactive surface opposite to the second active surface. The second active surface has a number of second bond pads. Part of the second active surface is attached to the second chip attaching surface and the third chip attaching surface in the way of avoiding the second chip attaching surface and the third chip attaching surface covering the second bond pads. The wires are used for electrically connecting the first bond pads and the second bond pads to the wire connecting surfaces of the inner leads. A space is formed between the first chip and the second chip to avoid the first chip pressing part of the wires electrically connected to the second chip.

Other objects, features, and advantages of the invention will become apparent from the following detailed description of the preferred but non-limiting embodiments. The following description is made with reference to the accompanying drawings.

DETAILED DESCRIPTION OF THE INVENTION

FIRST EMBODIMENT

Figure 1:
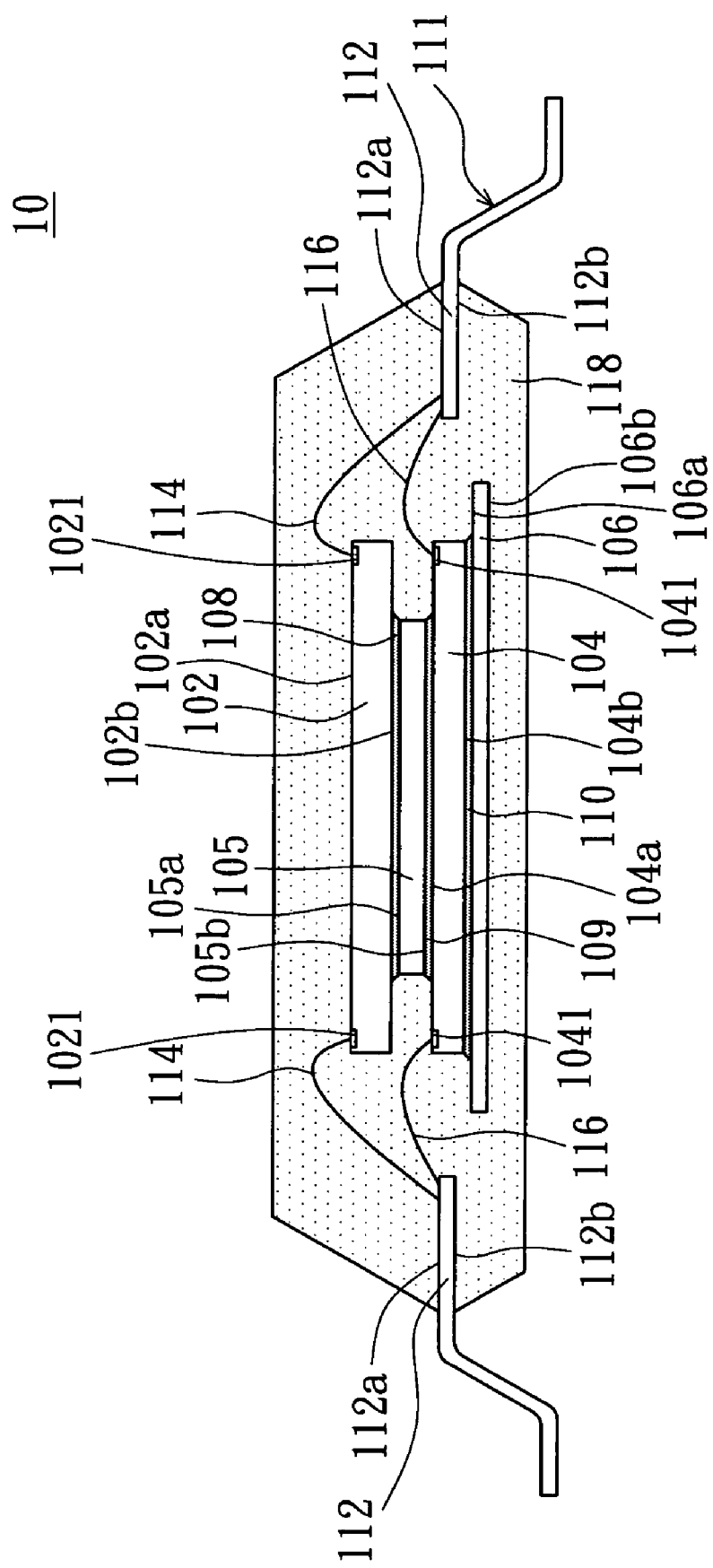
FIG. 1 (Prior Art) is a cross-sectional view of a conventional multi-chip package.
Figure 2:
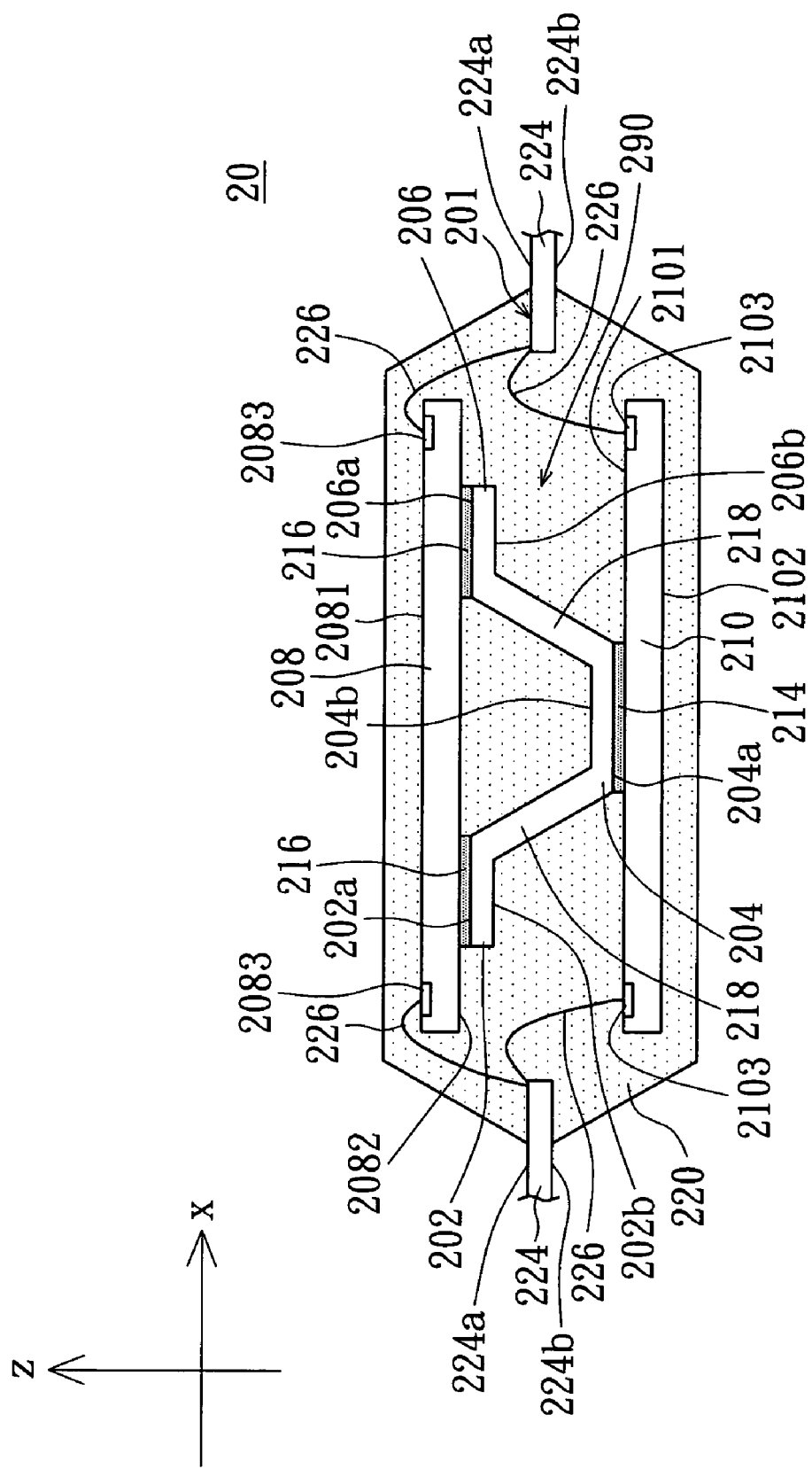
FIG. 2 is a cross-sectional view of a multi-chip package according to the first embodiment of the preferred embodiment of the invention.

Referring to FIG. 2, it is a cross-sectional view of a multi-chip package according to the first embodiment of the preferred embodiment of the invention. A multi-chip package 20 includes a leadframe 201, two chips 208, 210 with the same size or similar sizes, a number of wires 226, and an encapsulant 220. The leadframe 201 is designed in order to make the chips 208 and 210 face the same direction. The leadframe 201 has a first die pad, a second die pad, a number of connecting structures 218 and a number of inner leads 224.

The first die pad has a first chip attaching surface and a first unoccupied surface opposite to the first chip attaching surface. The second die pad has a second chip attaching surface and a second unoccupied surface opposite to the second chip attaching surface. The connecting structures 218 are used for connecting the first die pad and the second die pad so as to make the first unoccupied surface face the second unoccupied surface. Each of the inner leads 224 has a wire connecting surface 224a and a wire non-connecting surface 224b opposite to the wire connecting surface 224a. The wire connecting surfaces 224a, the first chip attaching surface and the second unoccupied surface face a first direction, such as +Z direction. The wire non-connecting surfaces 224b, the second chip attaching surface and the first unoccupied surface face a second direction opposite to the first direction, such as –Z direction. The first die pad, the second die pad, and the connecting structures 218 are integrally formed as an integral structure.

In the first embodiment, the first die pad includes two die pads 202 and 206, and the second die pad is a die pad 204. The die pad 204 has a chip attaching surface 204a and an unoccupied surface 204b, both of which are the above-mentioned second chip attaching surface and the second unoccupied surface, respectively. One side of the die pad 202 is connected with one side of the second die pad 204 via one part of the connecting structures 218. The die pad 202 has a chip attaching surface 202a and an unoccupied surface 202b opposite to the chip attaching surface 202a. The chip attaching surface 202a is belonged to the above-mentioned first chip attaching surface and the unoccupied surface 202b faces the unoccupied surface 204b. One side of the die pad 206 is connected with another side of the second die pad 204 via another part of the connecting structures 218. The die pad 206 has a chip attaching surface 206a and an unoccupied surface 206b opposite to the chip attaching surface 206a. The chip attaching surface 206a is belonged to the above-mentioned first chip attaching surface and the unoccupied surface 206b faces the unoccupied surface 204b. Further, the chip attaching surface 202a and 206a are located in the same plane. The die pad 204 is located between the die pads 202 and 206, and the die pad 204 is located under the die pads 202 and 206. The die pads 202, 204, 206, and the connecting structures 218 are integrally formed as an integral structure and is waviness shaped or square-wave shaped, as shown in FIG. 2.

The chip 210 has an active surface 2101 and an inactive surface 2102 opposite to the active surface 2101. The active surface 2101 has a number of bond pads 2103. The chip 208 has an active surface 2081 and an inactive surface 2082 opposite to the active surface 2081. The active surface 2081 has a number of bond pads 2083. Part of the active surface 2101 is attached to the chip attaching surface 204a via an adhesive layer 214 in the way of avoiding the chip attaching surface 204a covering the bond pads 2103, so that part of the wire 226 electrically connected to the bond pads 2103 of the bottom chip of the two chip will not be pressed by the upper chip of the two chips. The adhesive layer 214 includes at least one kind of non-electrical-conductive adhesive material. Part of the inactive surface 2082 is attached to the chip attaching surfaces 202a and 206a via an adhesive layer 216. The adhesive layer 216 includes at least one kind of electrical-conductive adhesive material or at least one kind of non-electrical-conductive adhesive material. One part of the wires 226 are used for electrically connecting the bond pads 2103 to the wire connecting surfaces 224a. Another part of the wires 226 are used for electrically connecting the bond pads 2083 to the wire connecting surfaces 224a. A space 290 is formed between the chips 208 and 210 to avoid the chip 208 pressing part of the wires 226 electrically connected to the chip 210. The encapsulant 220 is used for covering the die pads 202, 204, 206, the connecting structures 218, the chips 208, 210, the bond pads 2083, 2103, the wires 226 and part of the inner leads 224.

Figure 3A:
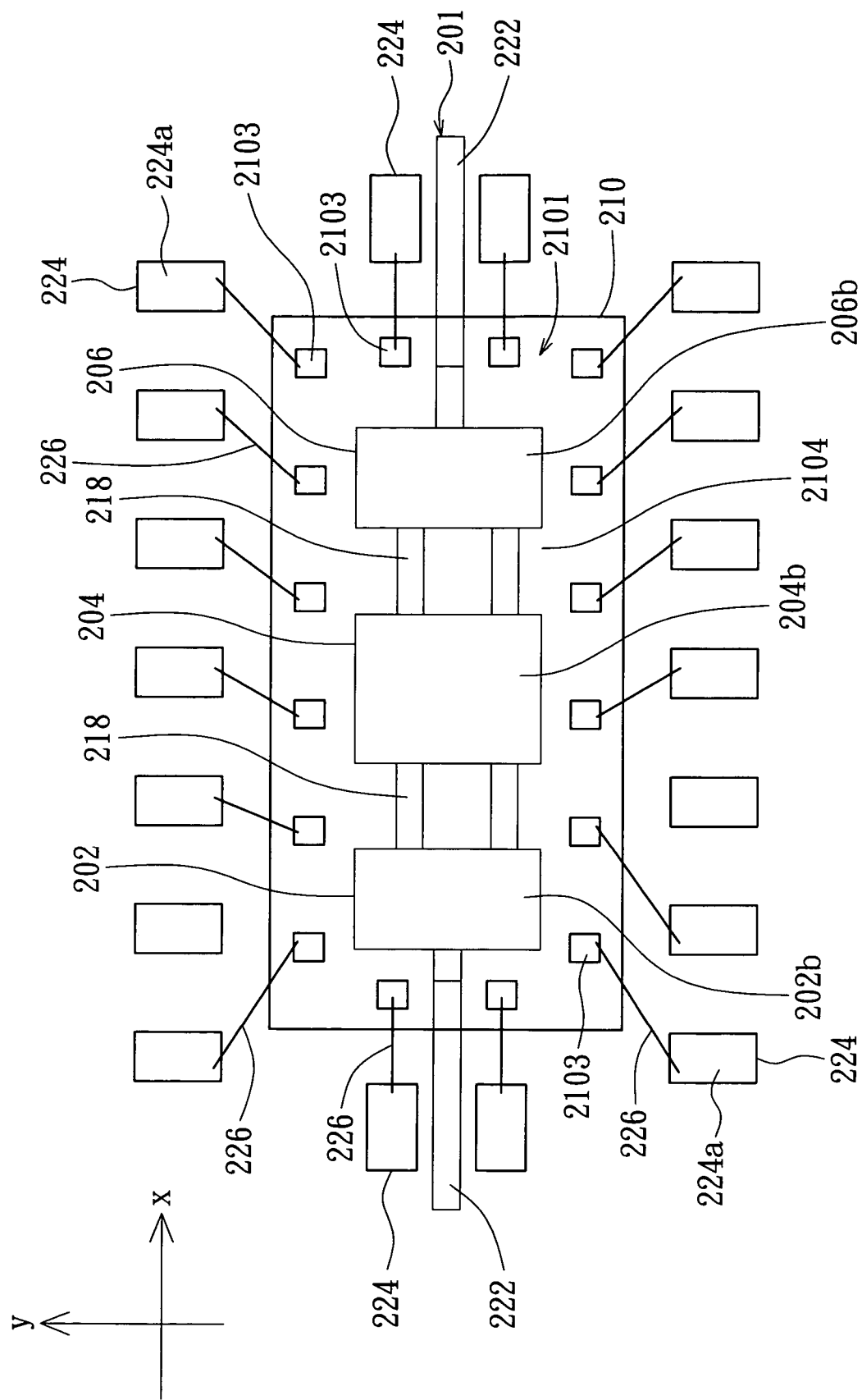
FIG. 3A is a top view showing the bottom chip of the two chips is electrically connected to the inner leads by wires in FIG. 2.
Figure 3B:
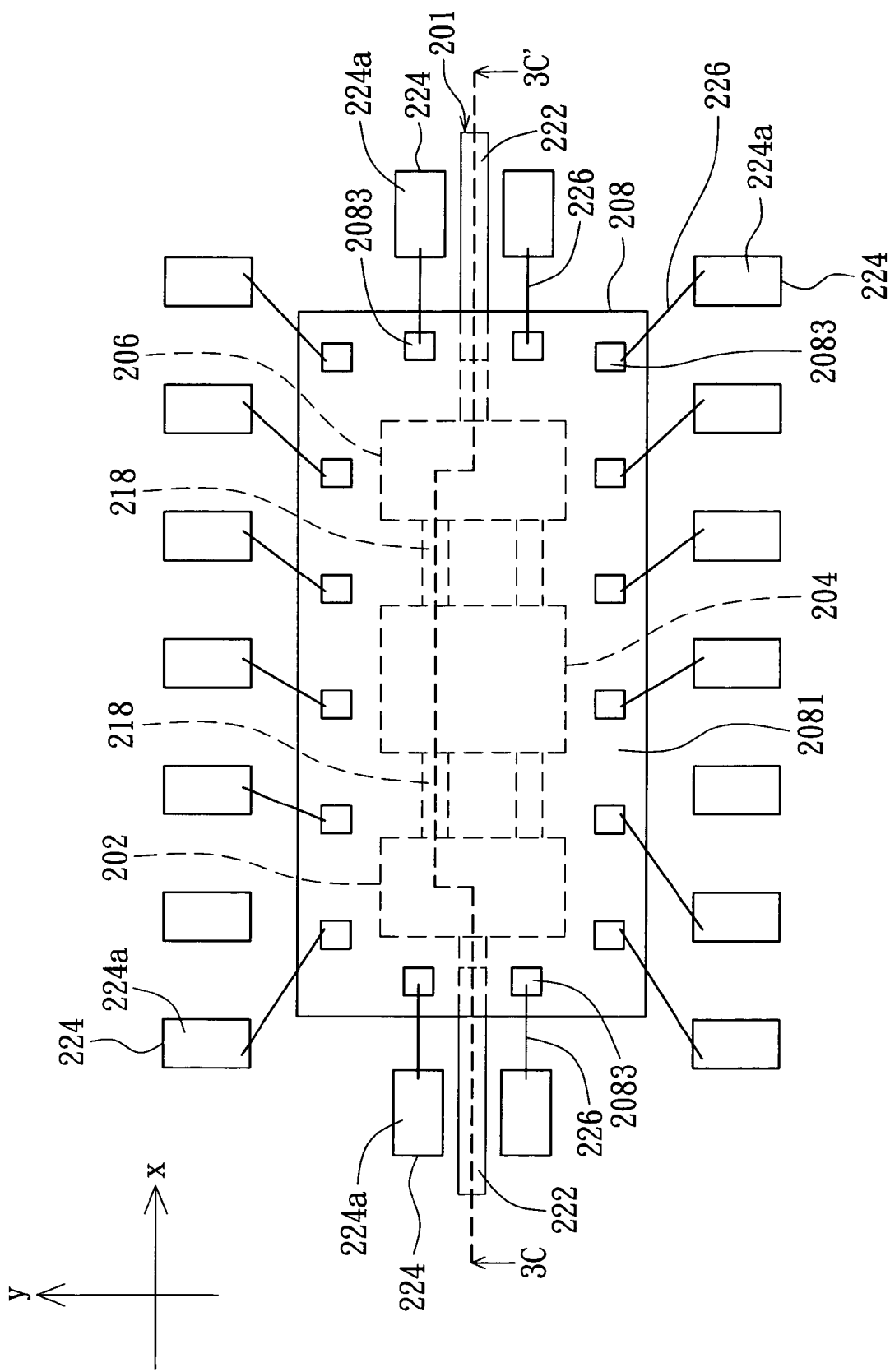
FIG. 3B is a top view of the multi-chip package in FIG. 2.
Figure 3C:
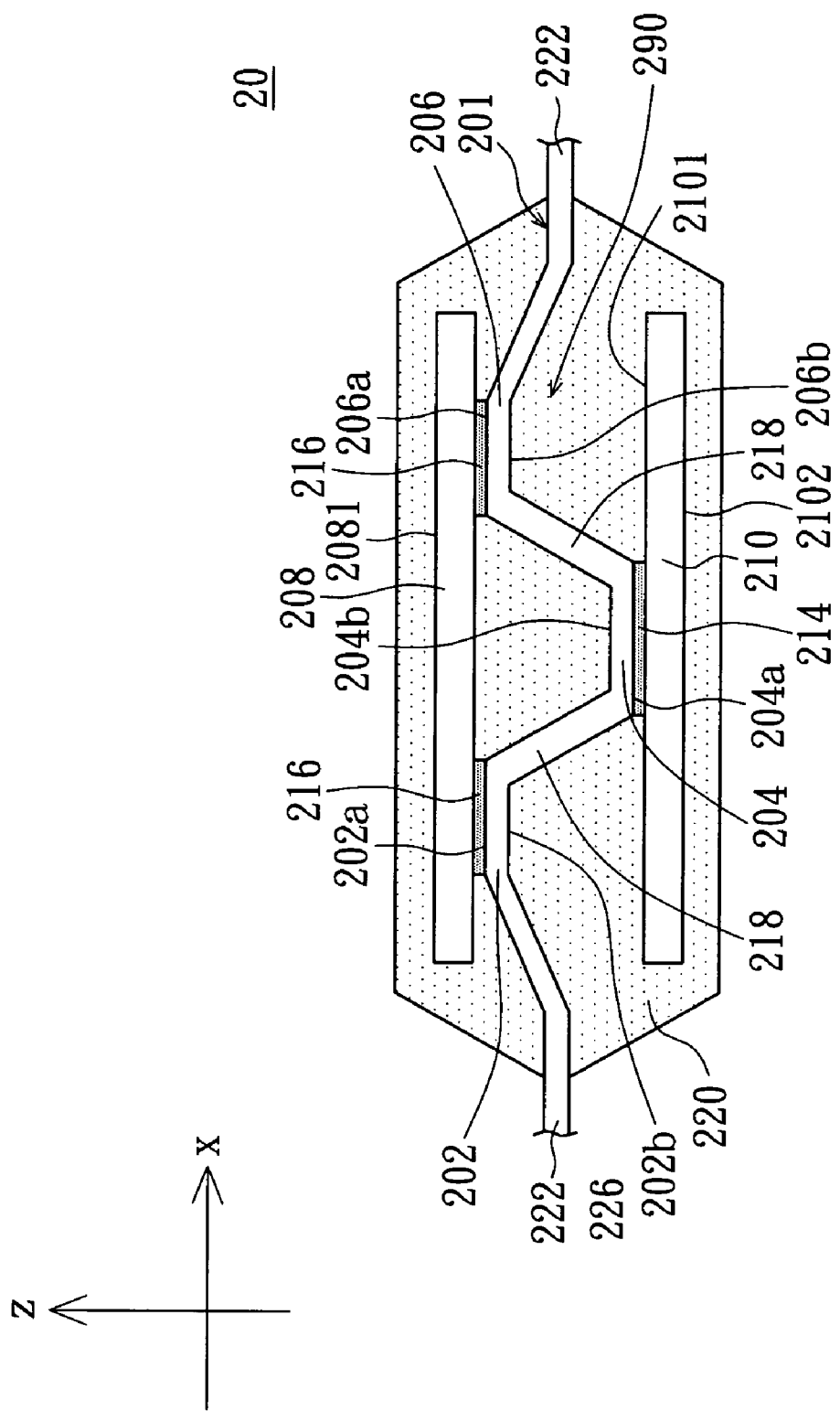
FIG. 3C is a cross-sectional view of the multi-chip package along the cross-sectional line 3C–3C' in FIG. 3B.

Referring to FIG. 3A~3C, FIG. 3A is a top view showing the bottom chip of the two chips is electrically connected to the inner leads by wires in FIG. 2, FIG. 3B is a top view of the multi-chip package in FIG. 2 and FIG. 3C is a cross-sectional view of the multi-chip package along the cross-sectional line 3C–3C' in FIG. 3B. In FIG. 3A~3C, the leadframe 210 further includes a number of tie bars, such as two tie bars 222. The tie bars 222 are used for supporting the die pads 202, 204, 206, and the connecting structures 218. In the FIG. 3A, one part of the wires 226 are used for electrically connecting the bond pads 2103 of the chip 210 to the wire connecting surfaces 224a after the chip 210 being attached to the die pad 204. In the FIG. 3B, another part of the wires 226 are used for electrically connecting the bond pads 2083 of the chip 208 to the wire connecting surfaces 224a after the chip 208 being attached to the die pads 202 and 206.

The multi-chip package disclosed in the first embodiment uses the connecting structures for providing a distance between two die pads at different altitudes to space two chips to avoid the upper chip pressing the wires electrically connected to the bottom chip. Also, omitting the design of spacers or dummy dies disposed between two chips, problem of more serious mismatch of coefficient of thermal expansion (CTE) can be reduced, so that the reliability of the multi-chip package can be kept.

SECOND EMBODIMENT

Figure 4:
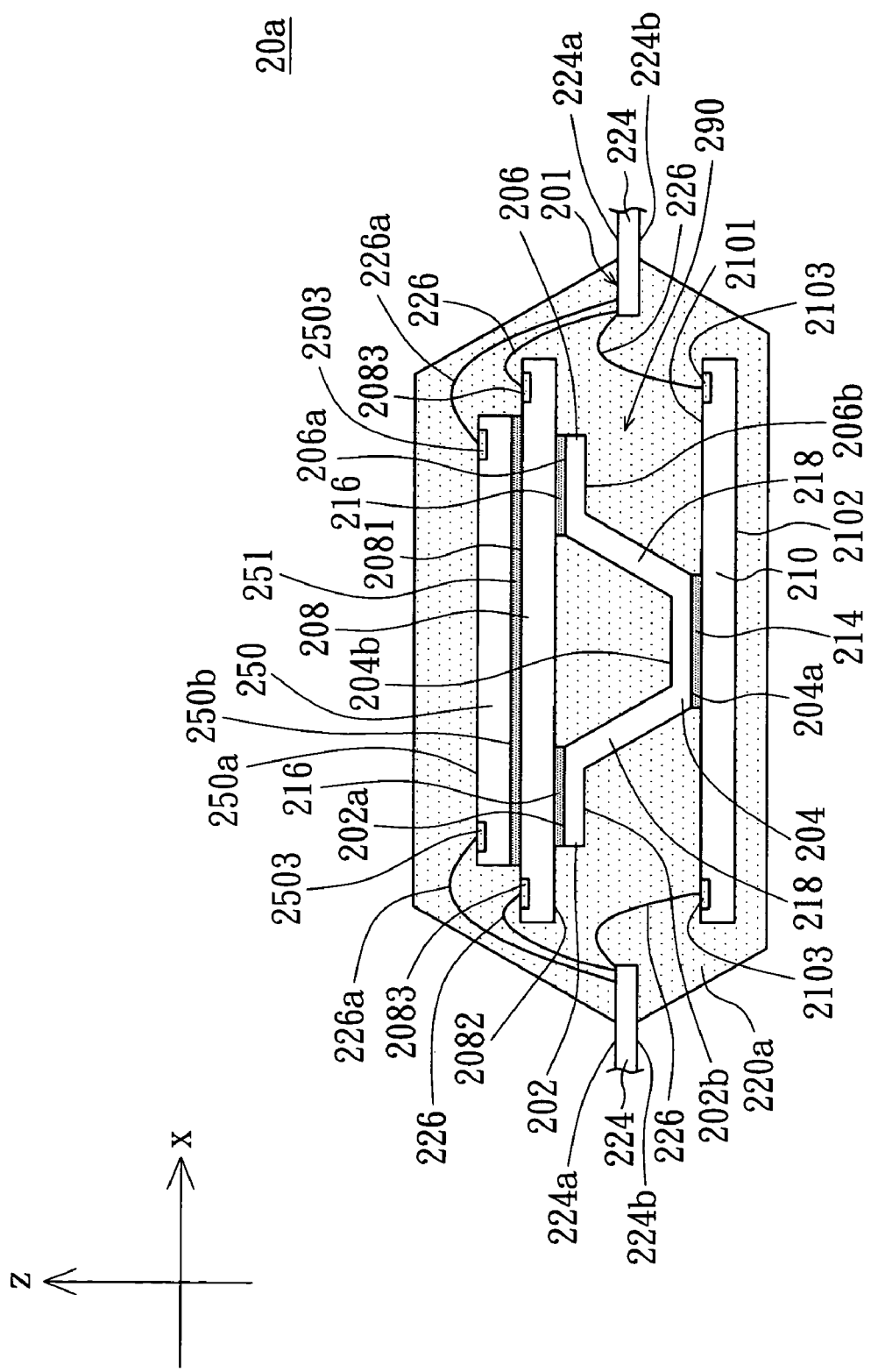
FIG. 4 is a cross-sectional view of a multi-chip package according to the second embodiment of the preferred embodiment of the invention.

Referring to FIG. 4, it is a cross-sectional view of a multi-chip package according to the second embodiment of the preferred embodiment of the invention. In FIG. 4, the difference between multi-chip package 20a in second embodiment and multi-chip package 20 disclosed in first embodiment lies in that multi-chip package 20a further includes a chip 250, a number of wire 226a and an encapsulant 220a. The size of the chip 250 is smaller than that of the chips 208 and 210. Other elements of multi-chip package 20a are the same with that of multi-chip package 20 and are not to be repeated here.

The chip 250 has an active surface 250a and an inactive surface 250b opposite to the active surface 250a. The active surface 250a has a number of bond pads 2503. The inactive surface 250b is attached to part of the active surface 2081 via an adhesive layer 251 in the way of avoiding the inactive surface 250b covering the bond pads 2083 and pressing part of the wires 226 electrically connected to the bond pads 2083. The adhesive layer 251 includes at least one kind of non-electrical-conductive adhesive material. The wires 226a are used for electrically connecting the bond pads 2503 to the wire connecting surfaces 224a of the inner leads 224. The encapsulant 220a is used for covering the die pads 202, 204, 206, the connecting structures 218, the chips 208, 210, 250, the bond pads 2083, 2103, 2503, the wires 226, 226a and part of the inner leads 224.

THIRD EMBODIMENT

Figure 5:
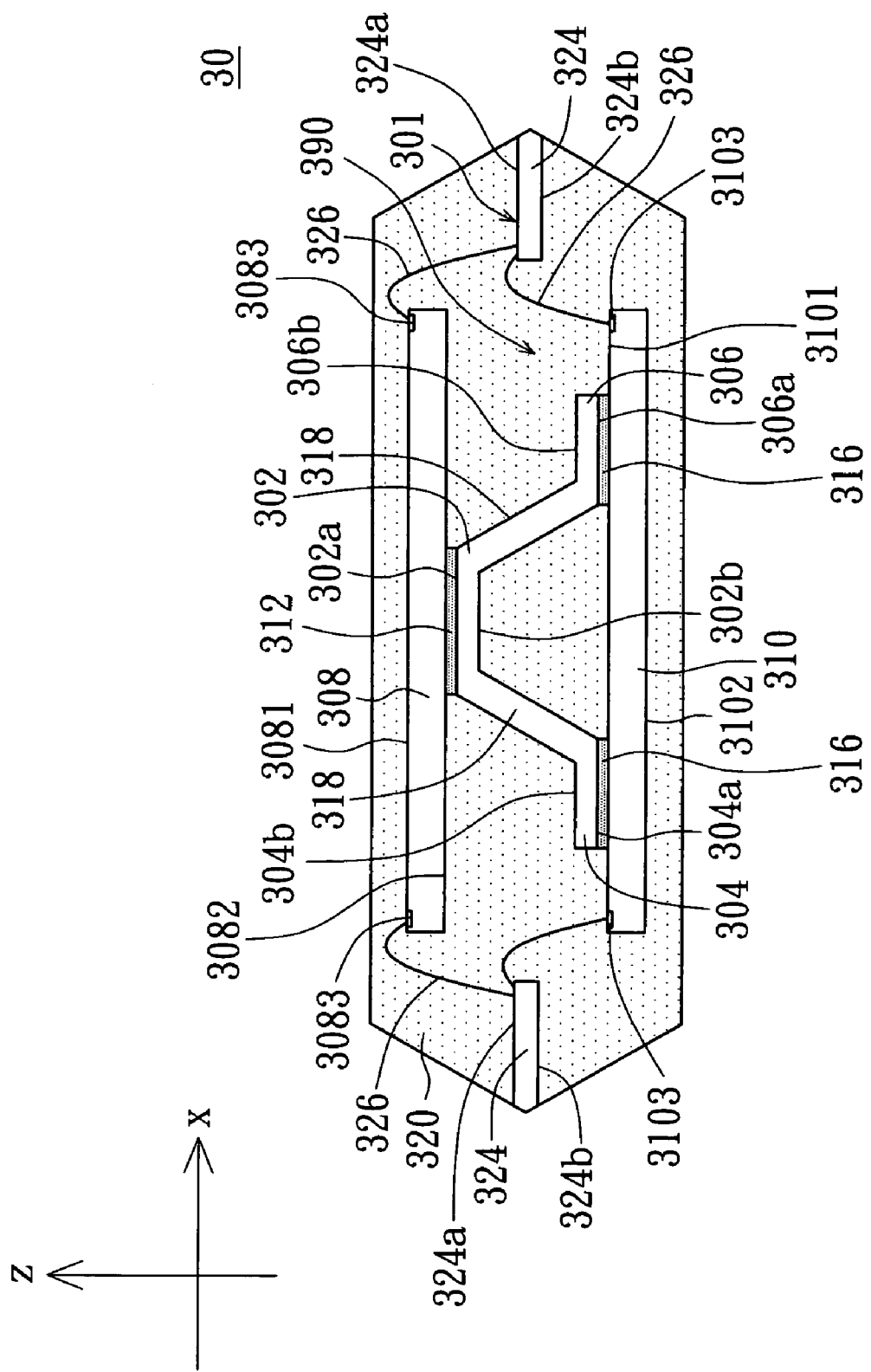
FIG. 5 is a cross-sectional view of a multi-chip package according to the third embodiment of the preferred embodiment of the invention.

Referring to FIG. 5, it is a cross-sectional view of a multi-chip package according to the third embodiment of the preferred embodiment of the invention. A multi-chip package 30 includes a leadframe 301, chips 308, 310, a number of wires 326, and an encapsulant 320. The leadframe 301 is designed in order to make the chips 308 and 310, with similar or same size, face the same direction. The leadframe 301 has a first die pad, a second die pad, a number of connecting structures 318 and a number of inner leads 324.

The first die pad has a first chip attaching surface and a first unoccupied surface opposite to the first chip attaching surface. The second die pad has a second chip attaching surface and a second unoccupied surface opposite to the second chip attaching surface. The connecting structures 318 are used for connecting the first die pad and the second die pad so as to make the first unoccupied surface face the second unoccupied surface. Each of the inner leads 324 has a wire connecting surface 324a and a wire non-connecting surface 324b opposite to the wire connecting surface 324a. The wire connecting surfaces 324a, the first chip attaching surface and the second unoccupied surface face a first direction, such as +Z direction. The wire non-connecting surfaces 324b, the second chip attaching surface and the first unoccupied surface face a second direction opposite to the first direction, such as –Z direction. The first die pad, the second die pad, and the connecting structures 318 are integrally formed as an integral structure.

In the third embodiment, the first die pad is a die pad 302, and the second die pad includes the die pads 304 and 306. The die pad 302 has a chip attaching surface 302a and an unoccupied surface 302b, both of which are the above-mentioned first chip attaching surface and the first unoccupied surface, respectively. The die pad 304 has a chip attaching surface 304a and an unoccupied surface 304b opposite to the chip attaching surface 304a. The chip attaching surface 304a is belonged to the above-mentioned second chip attaching surface and the unoccupied surface 304b faces the unoccupied surface 302b. One side of the die pad 304 is connected with one side of the die pad 302 via one part of the connecting structures 318. The die pad 306 has a chip attaching surface 306a and an unoccupied surface 306b opposite the chip attaching surface 306a. The chip attaching surface 306a is also belonged to the above-mentioned second chip attaching surface. The unoccupied surface 306b faces the unoccupied surface 302b. One side of the die pad 306 is connected with another side of the die pad 302 via another part of the connecting structures 318. Further, the die pads 304 and 306 are located in the same plane, and the die pad 302 is located above the die pads 304 and 306. The die pads 302, 304, 306, and the connecting structures 318 are integrally formed as a wave-shaped or square-wave shaped integral structure, as shown in FIG. 5.

The chip 310 has an active surface 3101 and an inactive surface 3102 opposite to the active surface 3101. The active surface 3101 has a number of bond pads 3103. The chip 308 has an active surface 3081 and an inactive surface 3082 opposite to the active surface 3081. The active surface 3081 has a number of bond pads 3083. Part of the active surface 3101 is attached to the chip attaching surfaces 304a and 306a via an adhesive layer 316 in the way of avoiding the chip attaching surface 304a and 306a covering the bond pads 3103, so that part of the wires 326 can be formed for electrically connecting the bond pads 3103 of the chip 310 to the inner leads 324. The adhesive layer 316 includes at least one kind of non-electrical-conductive adhesive material. Part of the inactive surface 3082 is attached to the chip attaching surface 302a via an adhesive layer 312. The adhesive layer 312 includes at least one kind of electrical-conductive adhesive material or at least one kind of non-electrical-conductive adhesive material. One part of the wires 326 are used for electrically connecting the bond pads 3103 to the wire connecting surfaces 324a. A space 390 is formed between the chips 308 and 310 to avoid the chip 308 pressing part of the wires 326 electrically connected to the chip 310. Another part of the wires 326 are used for electrically connecting the bond pads 3083 to the wire connecting surfaces 324a. The encapsulant 320 is used for covering the die pads 302, 304, 306, the connecting structures 318, the chips 308, 310, the bond pads 3083, 3103, the wires 326 and part of the inner leads 324.

Figure 6A:
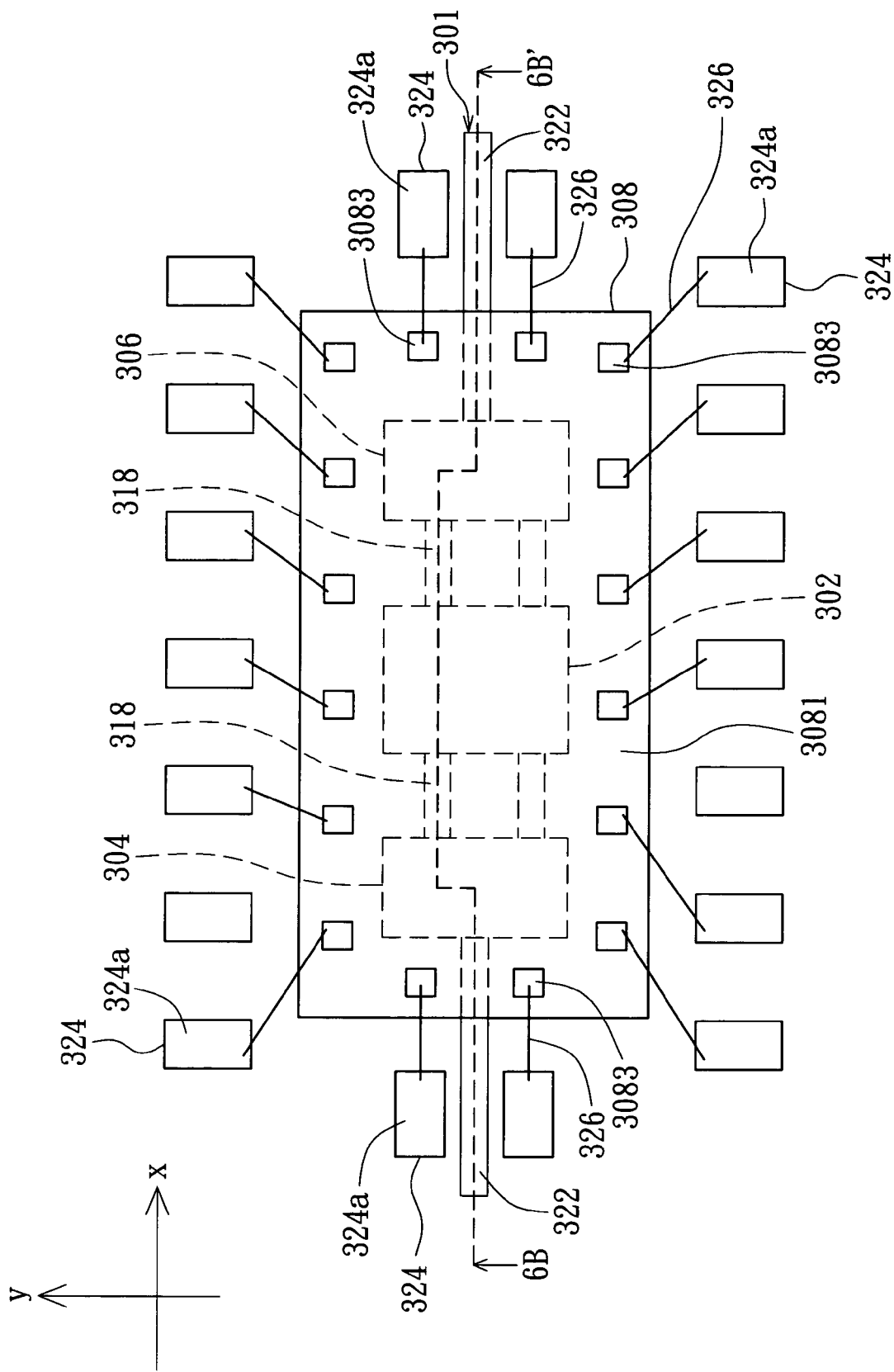
FIG. 6A is a top view of the multi-chip package in FIG. 5.
Figure 6B:
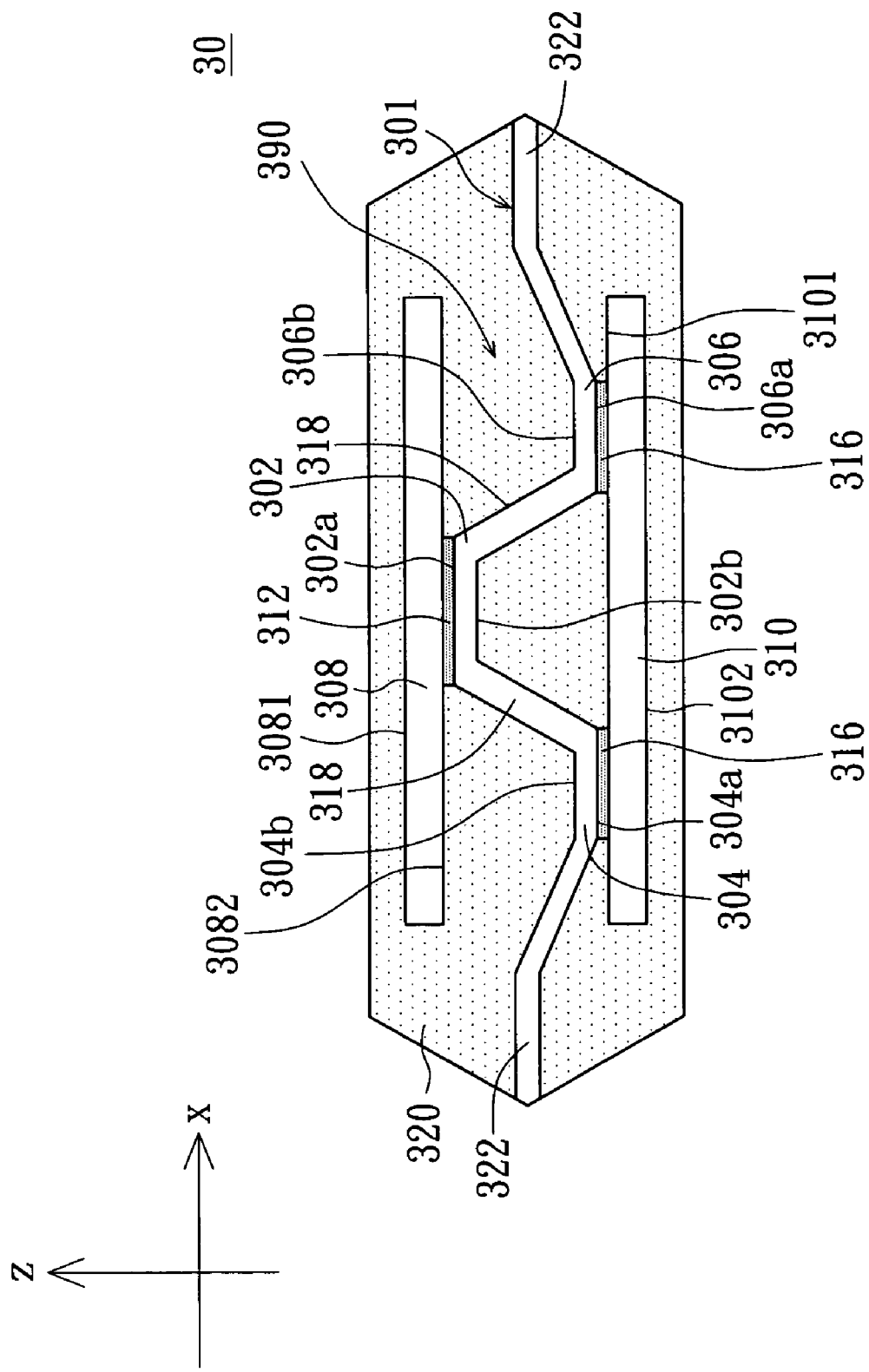
FIG. 6B is a cross-sectional view of the multi-chip package along the cross-sectional line 6B–6B' in FIG. 6A.

Referring to FIG. 6A~6B, FIG. 6A is a top view of the multi-chip package in FIG. 5 and FIG. 6B is a cross-sectional view of the multi-chip package along the cross-sectional line 6B–6B' in FIG. 6A. In FIG. 6A~6B, part of the wires 326 are used for electrically connecting the bond pads 3083 of the chip 308 to the wire connecting surfaces 324a after the chip 308 being attached to the die pads 302. The leadframe 301 further includes a number of tie bars, such as two tie bars 322. The tie bars 322 are used for supporting the die pads 302, 304, 306, and the connecting structures 318.

In the third embodiment, the multi-chip package disclosed in the preferred embodiments of the present invention uses two die pads at different altitudes to space two chips which are separately mounted thereon, so that the wires electrically connected to the bottom chip are not be pressed by the upper chip. Also, the configuration would not limit sizes of chips so that two chips with similar sizes or same sizes can be assembled together. Also, omitting the design of spacers or dummy dies disposed between two chips, problem of more serious mismatch of coefficient of thermal expansion can be reduced, so that the reliability of the multi-chip package can be kept.

FORTH EMBODIMENT

Figure 7:
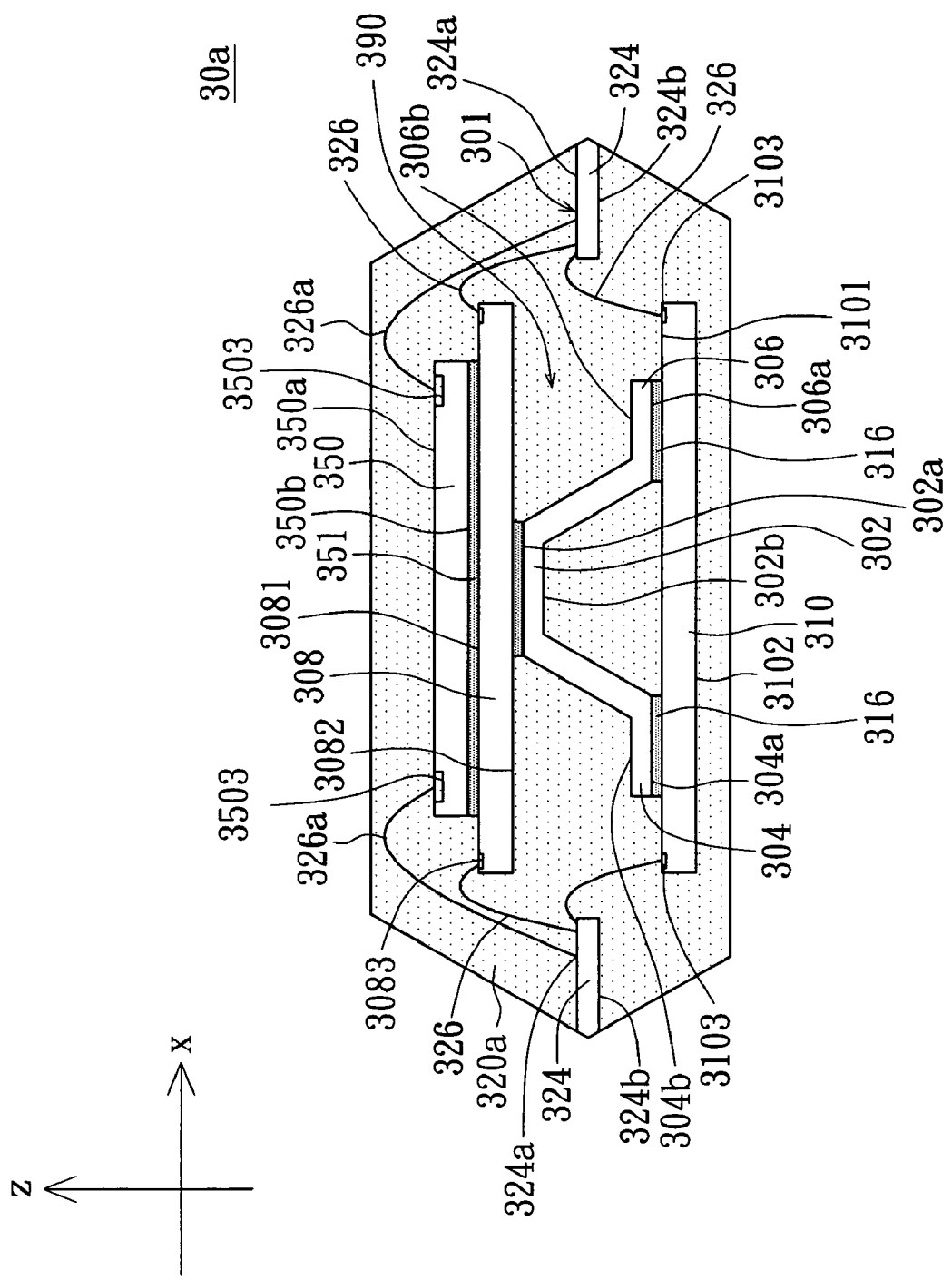
FIG. 7 is a cross-sectional view of a multi-chip package according to the forth embodiment of the preferred embodiment of the invention.

Referring to FIG. 7, it is a cross-sectional view of a multi-chip package according to the forth embodiment of the preferred embodiment of the invention. In FIG. 7, the difference between multi-chip package 30a in forth embodiment and multi-chip package 30 disclosed in third embodiment lies in that multi-chip package 30a further includes a chip 350, a number of wire 326a and an encapsulant 320a. The size of the chip 350 is smaller than that of the chips 308 and 310. Other elements of multi-chip package 30a are the same with that of multi-chip package 30 and are not to be repeated here.

The chip 350 has an active surface 350a and an inactive surface 350b opposite to the active surface 350a. The active surface 350a has a number of bond pads 3503. The inactive surface 350b is attached to part of the active surface 3081 via an adhesive layer 351 in the way of avoiding the inactive surface 350b covering the bond pads 3083, so that part of the wires 326 are formed for electrically connecting the bond pads 3083 to the inner leads 324. The adhesive layer 351 includes at least one kind of non-electrical-conductive adhesive material. The wires 326a are used for electrically connecting the bond pads 350 to the wire connecting surfaces 334a. The encapsulant 320a is used for covering the die pads 302, 304, 306, the connecting structures 318, the chips 308, 310, 350, the bond pads 3083, 3103, 3503, the wires 326, 326a and part of the inner leads 324.

The multi-chip package disclosed in the preferred embodiments of the present invention uses two die pads at different altitudes to space two chips which are separately mounted thereon, so that the wires electrically connected to the bottom chip are not be pressed by the upper chip. Also, the configuration would not limit sizes of chips so that two chips with similar sizes or same sizes can be assembled together. Also, omitting the design of spacers or dummy dies disposed between two chips, problem of more serious mismatch of coefficient of thermal expansion can be reduced, so that the reliability of the multi-chip package can be kept.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-chip package comprising:
a leadframe having a first die pad, a second die pad, a third die pad, a plurality of connecting structures and a plurality of inner leads, wherein the first die pad has a first chip attaching surface and a first unoccupied surface opposite to the first chip attaching surface, the second die pad has a second chip attaching surface and a second unoccupied surface opposite to the second chip attaching surface, the third die pad has a third chip attaching surface and a third unoccupied surface opposite to the third chip attaching surface, one part of the connecting structures are used for connecting the first die pad and the second die pad and another part of the connecting structures are used for connecting the first die pad and the third die pad so as to make the first unoccupied surface face the second unoccupied surface and the third unoccupied surface, wherein each of the inner leads has a wire connecting surface, the wire connecting surfaces, the first chip attaching surface, the third unoccupied surface and the second unoccupied surface face the same direction;

a first chip having a first active surface and a first inactive surface opposite to the first active surface, wherein the first active surface has a plurality of first bond pads, and one part of the first inactive surface is attached to the first chip attaching surface;

a second chip having a second active surface and a second inactive surface opposite to the second active surface, wherein the second active surface is attached to the second chip attaching surface and the third chip attaching surface in the way of avoiding the second chip attaching surface and the third chip attaching surface covering the second bond pads; and a plurality of first wires for electrically connecting the first bond pads and the second bond pads to the wire connecting surfaces;

wherein a space is formed between the first chip and the second chip to avoid the first chip pressing part of the first wires electrically connected to the second chip.

2. The multi-chip package according to claim 1, wherein the first die pad, the third die pad, the second die pad, and the connecting structures are integrally formed as an integral structure.

3. The multi-chip package according to claim 1, further comprising:

an encapsulant for covering the first chip, the second chip, the first die pad, the third die pad, the second die pad, the connecting structures, the first wires, and part of the inner leads.

4. The multi-chip package according to claim 1, further comprising:

a third chip having a third active surface and a third inactive surface opposite to the third active surface, wherein the third active surface has a plurality of third bond pads, wherein the third inactive surface is attached to part of the first active surface in the way of avoiding the third inactive surface covering the first bond pads.

5. The multi-chip package according to claim 4, further comprising:

a plurality of second wires for electrically connecting with the third bond pads and the wire connecting surfaces.

6. The multi-chip package according to claim 5, further comprising:

an encapsulant for covering the first chip, the second chip, the third chip, the first die pad, the third die pad, the fourth die pad, the connecting structures, the first wires, the second wires and part of the inner leads.

7. The multi-chip package according to claim 1, wherein the second die pad is connected to the third die pad via the connecting structures and the first die pad.

* * * * *